United States Patent [19]

Fleischmann et al.

[11] Patent Number: 5,126,706
[45] Date of Patent: Jun. 30, 1992

[54] SURFACE WAVE ARRANGEMENT WITH CONVERSION STRUCTURE FOR PREVENTING UNDESIRABLE REFLECTED WAVES

[75] Inventors: Bernd Fleischmann; Gerd Riha, both of Munich, Fed. Rep. of Germany

[73] Assignee: Siemens Aktiengesellschaft, Berlin and Munich, Fed. Rep. of Germany

[21] Appl. No.: 466,269
[22] PCT Filed: Sep. 19, 1988
[86] PCT No.: PCT/DE88/00584
§ 371 Date: May 9, 1990
§ 102(e) Date: May 9, 1990
[87] PCT Pub. No.: WO89/02675
PCT Pub. Date: Mar. 23, 1989

[30] Foreign Application Priority Data

Sep. 17, 1987 [DE] Fed. Rep. of Germany ....... 3731309

[51] Int. Cl.$^5$ .................... H03H 9/09; H03H 9/25; H03H 9/42
[52] U.S. Cl. .................... 333/151; 333/153; 333/194; 310/313 R; 310/313 D
[58] Field of Search .................... 333/150–154, 333/194, 195; 310/313 R, 313 B, 313 C, 313 D

[56] References Cited

U.S. PATENT DOCUMENTS

| 3,952,269 | 4/1976 | Bristol | 333/153 |
| 4,085,820 | 10/1977 | Solie | 310/313 R X |
| 4,130,813 | 12/1978 | Sandy et al. | 310/313 D X |
| 4,267,534 | 5/1981 | Tanski | 333/153 |
| 4,268,808 | 5/1981 | Melngailis | 333/153 X |
| 4,336,514 | 6/1982 | Paige | 333/153 X |
| 4,494,091 | 1/1985 | Goll | 333/151 |
| 4,618,841 | 10/1986 | Riha | 333/153 X |
| 4,623,855 | 11/1986 | Bulst | 333/195 |

FOREIGN PATENT DOCUMENTS

| 3230415 | 2/1984 | Fed. Rep. of Germany | 333/151 |
| 3544132 | 7/1986 | Fed. Rep. of Germany . | |
| 3700789 | 7/1987 | Fed. Rep. of Germany . | |

*Primary Examiner*—Eugene R. Laroche
*Assistant Examiner*—Benny L. Lee
*Attorney, Agent, or Firm*—Hill, Van Santen, Steadman & Simpson

[57] ABSTRACT

A surface device with a conversion structure (12) mounted on the substrate (2) but outside the surface of the substrate provided for surface wave propagation. The conversion structure eliminates undesirable surfaces which occur.

14 Claims, 2 Drawing Sheets

SURFACE WAVE ARRANGEMENT WITH CONVERSION STRUCTURE FOR PREVENTING UNDESIRABLE REFLECTED WAVES

Surface wave arrangements with converter and/or reflector structures on piezoelectric substrate bodies are sufficiently known.

In order to avoid disturbances caused by surface waves reflected at the edges of the substrate body, it is customary to coat the edges or end faces of the substrate body and the surface regions thereof adjoining these edges with an acoustically inelastic, i.e. damping, material. Such a material serves as a sink for surface waves. Surface waves running into such a sink are absorbed and damped there and, in particular, are not reflected again. This absence of reflection causes the desired surface wave propagation in the manner envisaged.

Although, as seen from the standpoint of the wave propagation, this method yields a result which is satisfactory per se, there are nevertheless disadvantages connected with such a measure. As a rule, material for such a sink is organic material, which is not free from the effect of contamination on the remaining substrate surface. Even slight degrees of contamination of the substrate surface in the region of the envisaged surface wave propagation can, however, lead to very serious disturbances. Such a sink represents a relatively large surface of such an organic material and, on the other hand, this material directly adjoins the surface regions of the substrate body which are to be kept free of contamination.

DESCRIPTION OF THE PRIOR ART

U.S. Pat. Nos. 4,623,855, 4,728,912 and German A-3700789 (British 2,186.456) were cited in the International Bureau preliminary examination report for the corresponding international application. However, none of these disclose a conversion structure which converts the described type of wave generated in order to avoid surface waves reflected by the edges of the substrate, where the distances between adjacent stripes are clearly different from the distances in a known reflecting structure according to the dimensioning rules of this invention.

It is the object of the present invention to find a new measure with which it is possible to avoid the development, possible per se and due to reflection of surface waves at substrate edges, of reflected surface waves in surface regions of the substrate body, where the occurrence of surface waves is not desirable per se.

The present invention is based upon the idea of avoiding, at least if possible, using a sink of organic material, or of at least very considerably reducing the amount of such material known to be employed according to the prior art in order to achieve this effect. The different principal on which the invention is based is, instead of the inelastic disturbance of such surface waves, to provide the elastic disturbance of such waves, but in addition to convert such an undesirable surface wave into a different form. This is preferably the form of a bulk wave. The occurrence of bulk waves is undesirable, and in the case of the present invention measures are taken such that the bulk waves which are intentionally generated have a direction so that they do not disrupt the effective surface-wave propagation region of the converter and/or reflector structures. In particular, for the surface waves which are converted into bulk waves are caused to travel at an angle which is directed away from the substrate surface so that these bulk waves reach the region of the inelastic damping adhesive which secures the substrate body to the support or in the housing.

The reference to this adhesive is only an apparent contradiction to what has been said above concerning the organic material of a sink. For one thing, such an adhesive material joining the substrate body to the support is located exclusively on the back of the substrate body. Virtually the entire adhesive material is covered by this rear surface of the substrate body and by the bearing area in the housing. It is only the extraordinarily narrow edges, and these alone, which are in direct contact with the internal atmosphere of the housing.

However, what has been said above is not a contradiction of the embodiment which is to be preferred, in which the substrate body is held in the housing by means of a connection other than the employment of an adhesive. In such a case, energy of the bulk wave runs in the substrate body and loses its energy by multiple reflections at the boundary surfaces of the substrate body. In this way, too, the aim of the invention is achieved.

A conversion structure applied according to the invention is, e.g., a structure which is raised on the surface of the substrate body, that is to say in the surface regions in which the occurrence of surface waves is in any case undesirable per se. This structure can, e.g., be of material applied to the surface, such as metal, but also of silicon dioxide and similar material. In contrast to this, it is also possible to provide sunken, e.g. etched-in, structures as surface disturbance of the substrate body. Preferably, such a conversion structure consists of finger strips, e.g. of metal, which are used for reflector structures of a surface wave arrangement. Essentially, such strips are made to run orthogonally or obliquely to the direction of wave propagation of the surface waves in the converter and/or reflector structure. Such strips can also be curved. Further, there is no pressing need for a continuous strip. Rather, the individual strips can have interruptions so that such strips are, e.g., dashed line structures. The strips themselves can be mounted so that they are equidistantly and periodically located, and/or in accordance with a random distribution. An equidistant distribution is easy to construct. Periodic distribution has the advantage of the traceability of an acquired frequency range. Random distribution promotes the avoidance of undesirably occurring singular points.

Further explanations result from the following description relating to figures for illustrative embodiments of the invention.

After further explanation, four illustrative embodiments of the invention result from the following description relating to the figures.

Figure 1:
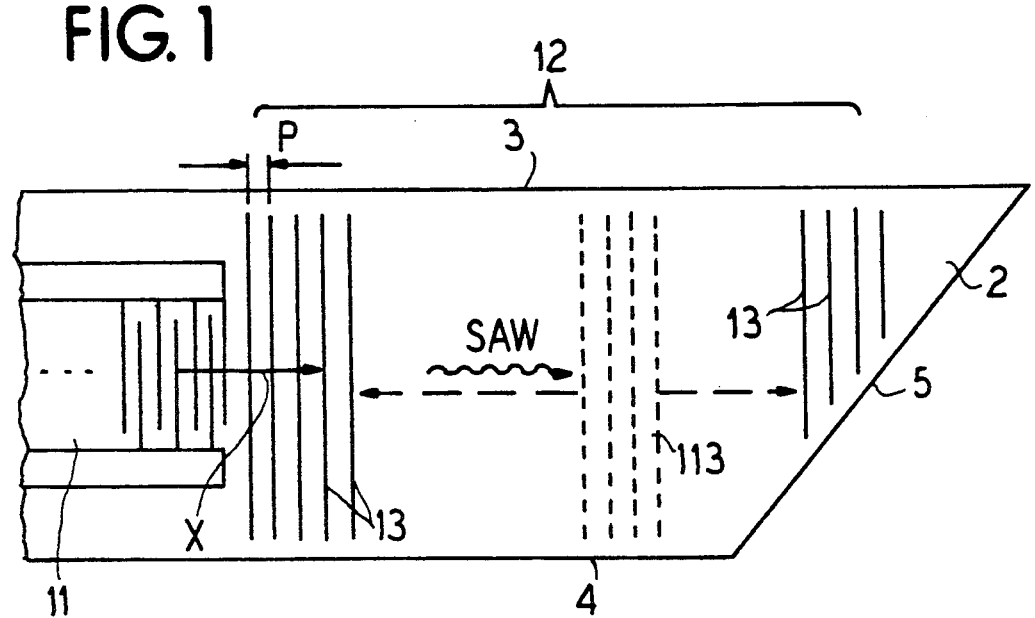
FIG. 1 shows a first embodiment of a surface wave arrangement according to the invention with a first type of conversion structure.

The customary substrate body of a surface wave arrangement 2 is shown in FIG. 1. This substrate body 2 possesses the lateral faces 3 and 4, and the terminal end face 5 which is constructed, as is customary, at a slant. Of these faces 3, 4 and 5, only the edges at the border of the surface of the substrate body 2 are to be seen, in each case, in the plan view of FIG. 1. Note 11 designates a customary transducer structure present on the substrate body, and that transducer structure which is closest to the left-hand end of the substrate body represented in FIG. 1. A surface wave SAW running in the indicated direction x from the transducer 11 onto the end face 5 would experience reflection at this end of the substrate body 2. Although the disturbing influence of the reflection is strongly minimized by the slanting direction of the end face 5, because of multiple reflections a certain proportion of the surface wave energy traveling in the direction x from the transducer 11, passes back into the surface wave arrangement.

According to the invention, the transducer structure 12 is formed as a strip, and consists of disturbances in/on the surface of the substrate body 2 which are effective for the acoustic surface wave SAW. For example, strips 13 can be metallized strips, such as are also employed for the fingers of the transducer 11. However, they can also be strips 13 of applied silicon dioxide, aluminum dioxide and the like. Instead of such raised structures on the surface, such strips can also be formed as grooves, trenches or the like, which have been etched into the surface of the substrate body 2. Such a transducer structure 12 consists of a plurality of parallel strips equally spaced from each other, although only a portion of such strips is represented in FIG. 1. A special form of strip 113, consists of strips that extend in the longitudinal direction and are formed as dashed lines, as shown.

In the illustrative embodiment according to FIG. 1, the strips 13, 113 are aligned essentially orthogonal to the propagation direction x of the surface wave SAW.

Figure 2:
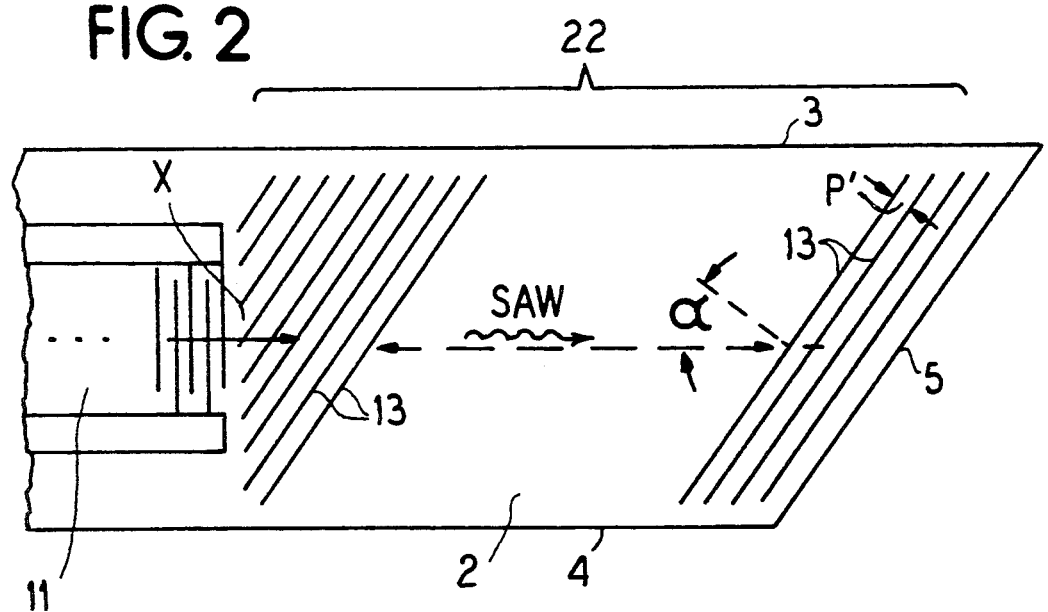
FIG. 2 shows a second embodiment with a second type of conversion structure.

FIG. 2 shows an embodiment similar to FIG. 1 with reference symbols some of which have been described with reference to FIG. 1. The transducer structure 22 consists, in the case of the embodiment according to FIG. 2, of strips 13, which are oriented at a slant angle to the wave propagation direction x.

Figure 3:
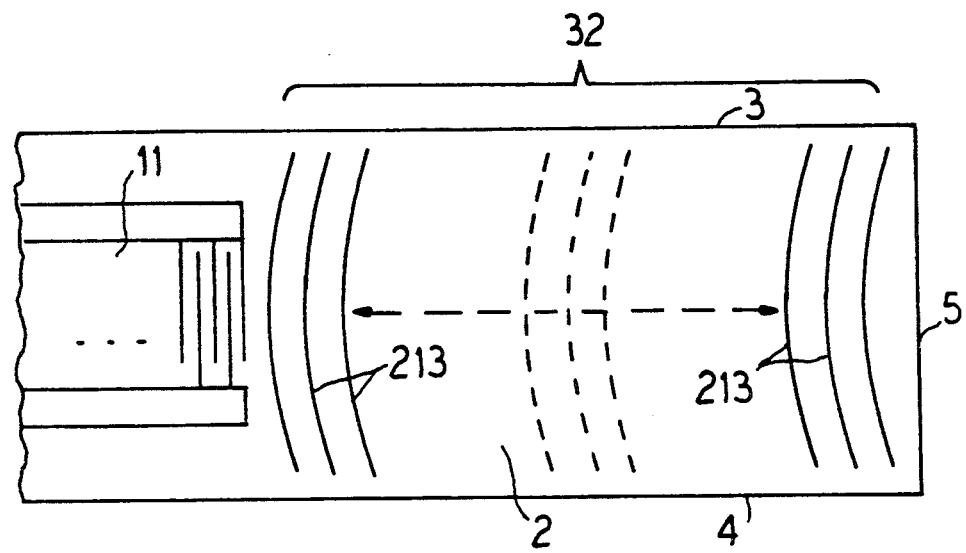
FIG. 3 shows a third embodiment with a third type of conversion structure.

FIG. 3 shows a further embodiment with strips 213 of the transducer structure 32 which have been formed as curves. The transducer structure 32 can also consist of dashed lines, as has been explained in relation to the preceding embodiments.

Figure 4:
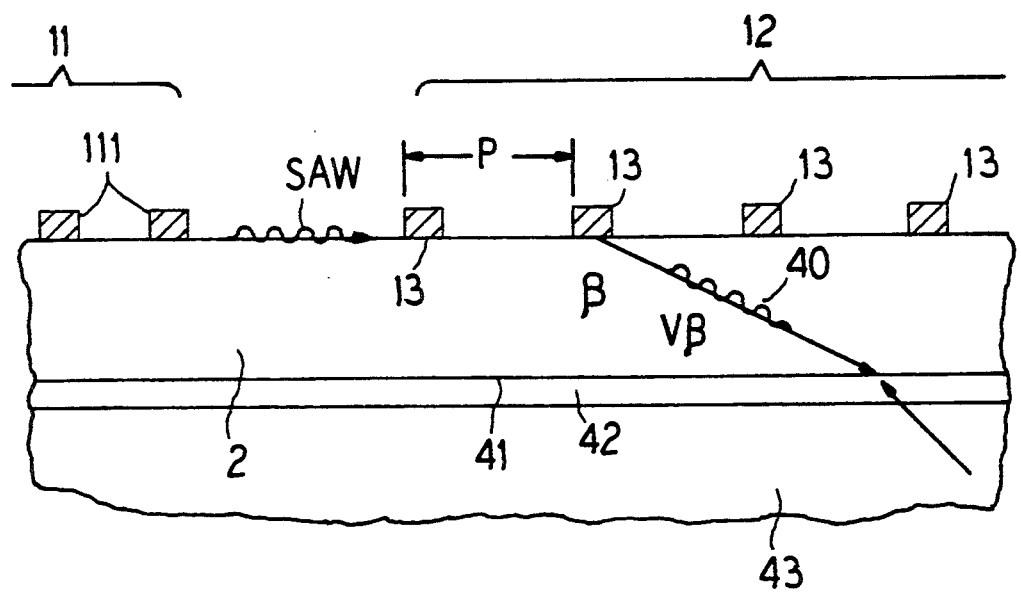
FIG. 4 shows a schematic representation for the purpose of further explanation.

FIG. 4 indicates to the person skilled in the art the dimensions of a transducer structure according to the invention.

FIG. 4 is a side view in which the raised strips 13, e.g. metallized strips, are represented in cross-section. In addition, two fingers 111 of the transducer structure 11 are represented.

A surface wave SAW running in the surface in the direction x from the transducer 11 is disturbed by the strips 13 of the transducer structure 12. This disturbance can be understood to mean that at an edge H of each strip 13 a cylindrical wave is emitted in each case into the substrate body 2 forming the lower half space. The longitudinal extent of the strips 13 results in a cylindrical symmetry for such a wave generation. Such a wave generation takes place at each individual strip 13. Assuming an equidistant spacing P of the arrangement of the strips 13 on the surface of the substrate body 2, the result is an interference pattern of the surface wave which is disturbed at the edges of the particular strips 13, so that a wave occurs which is represented by the vector $V_\beta$. Such a wave indicated by 40 is a bulk wave in the substrate body 2, which has been generated by the surface wave SAW, that is to say because of the presence of these surface disturbances. The energy of this bulk wave 40 comes from the energy of the SAW wave, so that in accordance with the transducer provided according to the invention the SAW wave can be made to vanish.

It is clear that in the regions where the transducer structures 12, 22, 32, are located in which, given the particular surface wave arrangement, the occurrence of a surface wave SAW is undesirable, the energy of this surface wave is transformed according to the invention into the energy of a bulk wave. According to the interference principal used in the invention, an optimum conversion is obtained when the dimension is matched to the spacing P. The basis of this is the following equation $$\frac{1}{P \times f} \text{ less than } \frac{1}{v_{SAW}} + \frac{1}{v^*}$$

where f is the particular lower frequency limit of the transmission band of the relevant surface wave arrangement, where $v_{SAW}$ is the velocity of the SAW in the material of the substrate body, and $v^*$ is either a velocity which is $v_{max}$ which has the highest sound velocity of the bulk wave in the material of the substrate body 2, or which is $V_{BAW}$, which is the velocity of the slowest bulk wave (bulk acoustic wave), which contributes decisively to the surface wave SAW. If a Rayleigh wave is excited as surface wave in the arrangement, the velocity value of the vertically polarized (quasi-) shear wave is to be substituted for the velocity $V_{BAW}$. If the excited surface wave is a horizontally polarized surface shear wave, the velocity value of the horizontally polarized shear bulk wave is to be substituted for the velocity $V_{BAW}$. A conversion structure designed with the velocity $V_{BAW}$ and employed according to the invention makes it possible to achieve maximum damping per wavelength or optimum avoidance of the occurrence of surface waves otherwise reflected at the edges of the substrate body. Although a transducer structure of the invention which is dimensioned with $V_{max}$ does not quite yield the optimum damping values, such transducer structure has fewer reflections.

For slanted strips of the transducer structure, such as in the embodiment according to FIG. 2, the amount of the separation measured, as in FIG. 1, in the direction of the principal direction of wave propagation is to be transposed in accordance with the angle α between the principal direction of wave propagation x and the normal direction of the slanted strips of the conversion structure, so that the spacing is p · cos α = p' x p is the spacing of the stripes in the direction and p' is the spacing of the stripes in a direction at right angles to their longitudinal direction. In accordance with the transposed equation, this leads to $$\frac{1}{p \times \cos\alpha \cdot f} = \frac{1}{p' \times f} \text{ less than } \frac{1}{V_{SAW}} + \frac{1}{V^*} \times K$$

where $V^* = V_{BAW}$ or $= V_{max}$.

The correction factor k contained in this equation arises from the vectoral addition of the wave number vector $k_{SAW}$ (which is proportional to the reciprocal velocity $1/V_{SAW}$) and the wave number vector k of the relevant bulk wave. Moreover, the vector $k_{SAW}$ has the direction of the principal direction of wave propagation x. This addition has the vector sum $$\vec{k}_{Go} = \vec{k}_{SAW} = \vec{k}_{(bulk\ wave)}.$$

where the vector direction for $k_{Go}$ is equal to the direction orthogonal to the strips which are filled at the angle $\alpha$ as shown in FIG. 2. This yields the correction factor $$K = 1 + \tan^2\alpha \left(1 - \frac{V^{*2}}{V_{SAW}^2}\right)^{\frac{1}{2}}$$

which, like $\cos \alpha$, has the value of 1 for $\alpha$ equals 0, and can be disregarded for smaller angles, especially if, with regard to the values for p "less than", has not yielded a particularly good approximation to value the optimum at "equal to".

FIG. 4 shows how a bulk wave 40 at the angle $\beta$ to the surface passes through the substrate body 2 to the lower surface 41 of the substrate body 2 which is relatively thin per se. From there, a proportion of the energy of the bulk wave 40 can pass into the adhesive layer 42 with which the substrate body 2 is bonded to the support 43 of the housing. A feature of the invention is to provide an equidistant spacing dimension P. The structure 12 which, taking into account the angle $\beta$, corresponds to the periodicity of the wave propagation of the bulk wave 40, or to be precise of the wave 40 with a frequency f which is predetermined by the SAW wave of the transducer structure 11.

Instead of an equidistant spacing dimension P, it can be advantageous to select values which although lying near the value P, correspond to a periodic distribution and which lie around the computed value P. This comprises a modulation of the computed value p. Such a measure is important particularly for surface wave arrangements of broader bands. Instead of a periodic spacing distribution of such a "modulation", it is also possible for the values P±dP to be distributed in accordance with a random distribution. P is the spacing between stripes and dP is the rate of change of P which is the modulation of P.

We claim:

1. A surface wave arrangement with a piezoelectric substrate body (2) which has one surface (41); and a second surface being provided with a transducer which consists of parallel finger strips for generating a predetermined type of surface wave, said surface wave propagating in a first direction "X", a support (43), an adhesive layer (42) between said support (43) and said substrate body (2) and in contact with said first surface (41), at least one reflector structure consisting of a plurality of parallel reflector strips, which are tuned to receive the predetermined surface waves, mounted on said second surface, said transducer and said reflector structure (12, 22, 32) converting the generated predetermined surface waves, into bulk waves which travel into said substrate body toward said first surface (41), and into said adhesive layer (42) to absorb said bulk waves, said reflector structure (12, 22, 32) consists of a number of parallel reflector strips (13, 113) mounted on the second surface of said substrate body (2) and said reflector strips are parallel to each other and are spaced apart at intervals (P) from each other, and extend generally transverse to the first direction of wave propagation (X), the spacing (P) of the strips (13, 113, 213) is determined according to the equation:

$$\frac{1}{p^* f} \text{ less than } \frac{1}{V_{SAW}} + \frac{1}{V^*}$$

where f is the lower frequency limit of the surface wave, where $V_{SAW}$ is the velocity of the surface wave (SAW) in the material of the substrate body (2), and where $V^*$ is a velocity of a bulk wave which is developed by said conversion, and where $V^*$ is either a highest velocity (Vmax) in the material of the substrate body or where $V^*$ has a lowest velocity ($V_{BAW}$) in the material of the substrate body.

2. Surface wave arrangement according to claim 1, characterized in that in the case of excitation of a surface wave (SAW) of the type of a Rayleigh wave, the velocity ($V_{BAW}$) is the velocity of a vertically polarized shear wave.

3. Surface wave arrangement according to claim 1, characterized in that in the case of excitation of a surface wave (SAW) of the type of a Rayleigh wave, the velocity ($V_{BAW}$) is the velocity of a horizontally polarized shear bulk wave.

4. Surface wave arrangement according to claim 1, 2 or 3, characterized in that the transducer structure (12, 22, 32) consists of material disposed on to the second surface of the substrate body.

5. Surface wave arrangement according to claim 4, characterized in that said material is electrically non-conductive.

6. Surface wave arrangement according to claim 4, characterized in that said material is a metal oxide.

7. Surface wave arrangement according to claim 4, characterized in that the material is metal.

8. Surface wave arrangement according to claim 1 or 3, characterized in that the transducer structure is disposed into the second surface of said substrate.

9. Surface wave arrangement according to claim 8, characterized in that the transducer structure is a structure etched into the substrate.

10. Surface wave arrangement according to claim 9, characterized in that the strips are aligned essentially orthogonal to the first direction of wave propagation.

11. Surface wave arrangement according to claim 9, characterized in that the strips are aligned essentially at a slant angle to the first direction of wave propagation.

12. Surface wave arrangement according to claim 1, characterized in that the parallel strips (213) are curved.

13. Surface wave arrangement according to claim 1, characterized in that the parallel strips (113) are formed of intermittent conducting and blank areas.

14. Surface wave arrangement according to claim 1, characterized in that the parallel strips are arranged equidistant from each other.

* * * * *